United States Patent
Thyzel

(10) Patent No.: US 6,771,505 B2
(45) Date of Patent: Aug. 3, 2004

(54) POWER ELECTRONICS UNIT

(75) Inventor: Bernd Thyzel, Schlossborn (DE)

(73) Assignee: Siemens Aktiengesellschaft, München (DE)

(*) Notice: Subject to any disclaimer, the term of this patent is extended or adjusted under 35 U.S.C. 154(b) by 0 days.

(21) Appl. No.: 10/330,949

(22) Filed: Dec. 27, 2002

(65) Prior Publication Data

US 2003/0148653 A1 Aug. 7, 2003

(30) Foreign Application Priority Data

Jan. 3, 2002 (DE) .......................................... 102 00 066

(51) Int. Cl.$^7$ ................................................. H05K 7/20
(52) U.S. Cl. ....................... 361/704; 361/707; 361/719; 174/252; 257/713
(58) Field of Search ................................. 361/700–712, 361/717–723, 760–761, 767, 772–773; 257/706, 712; 174/16.1, 16.2, 252; 165/80.3, 185

(56) References Cited

U.S. PATENT DOCUMENTS

| | | | | | |
|---|---|---|---|---|---|
| 5,410,449 | A | * | 4/1995 | Brunner | 361/719 |
| 5,466,969 | A | * | 11/1995 | Tsunoda | 257/706 |
| 6,226,183 | B1 | * | 5/2001 | Weber et al. | 361/704 |
| 6,477,052 | B1 | * | 11/2002 | Barcley | 361/719 |
| 6,477,054 | B1 | * | 11/2002 | Hagerup | 361/720 |
| 6,625,027 | B2 | * | 9/2003 | Rider et al. | 361/706 |

* cited by examiner

Primary Examiner—Boris Chervinsky
(74) Attorney, Agent, or Firm—Martin A. Farber

(57) ABSTRACT

A power electronics unit with a sheet-like carrier element, on which interconnects 5 are arranged for the electrical Connection of electrical power components 6 and control components 7 of a circuit, likewise located on the carrier element. The carrier element is a heat sink 1, on which the interconnects 5 have been applied by a heat-conducting adhesive 3, and a minimum thickness of the heat-conducting adhesive 3 to allow the heat-conducting adhesive 3 to be an electrical insulating layer is ensured by spacers 4 in the heat-conducting adhesive 3.

8 Claims, 1 Drawing Sheet

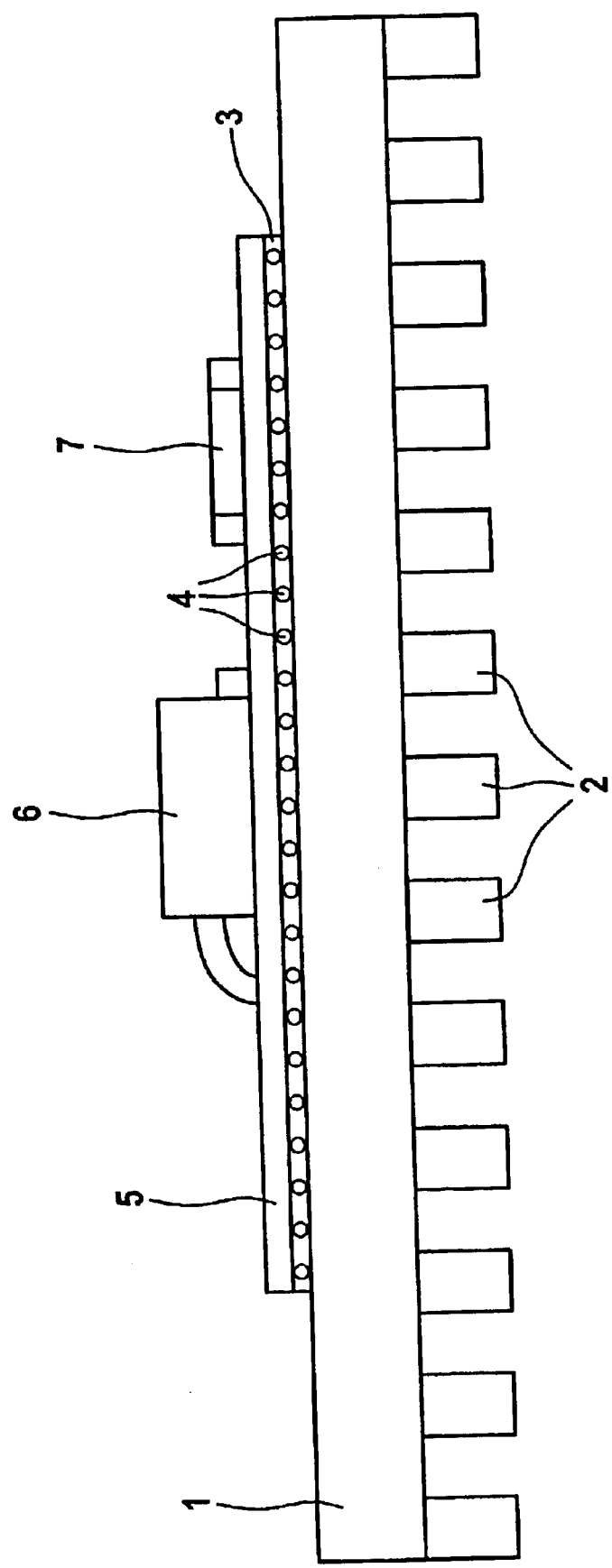

POWER ELECTRONICS UNIT

FIELD AND BACKGROUND OF THE INVENTION

The invention relates to a power electronics unit and to a method of producing a power electronics unit, in particular for a device in a motor vehicle, with a sheet-like carrier element, on which interconnects are arranged for the electrical connection of electrical power components and control components of a circuit, likewise located on the carrier element.

In the case of power electronics units of this type, it is known to arrange the interconnects and the power components and control components on an insulating carrier element, which may be a ceramic substrate, a printed circuit board or a DCB substrate. Separate means then have to be used for dissipating the heat generated by the power electronics.

These power electronics units have complex components, need considerable installation space and require great expenditure for their production.

SUMMARY OF THE INVENTION

It is therefore an object of the invention to provide a power electronics unit and a method of producing a power electronics unit which is simple and constructed with few components, requires little installation space, permits easy dissipation of the heat generated by the power components and can be produced by a few, simple steps.

This object is achieved according to the invention by the carrier element being a heat sink, on which the interconnects have been applied by means of a heat-conducting adhesive, and a minimum thickness of the heat-conducting adhesive to allow the heat-conducting adhesive to be an electrical insulating layer being ensured by spacers in the heat-conducting adhesive. In this case, the carrier element performs the dual function of substrate and heat sink, it being possible for any low-cost suitable material, including electrically conducting material, to be used for the carrier element, since the heat-conducting adhesive likewise serves with a dual function, not only for heat transmission but also for electrical insulation. To ensure the function of electrical insulation, the heat-conducting adhesive must have a minimum thickness. This is ensured in a way which is simple to produce by the spacers. The arrangement of the heat-producing power components very close to the heat sink and the minimized insulating layer thickness leads to good thermal coupling of the power components to the heat sink and consequently to good and largely direct heat dissipation.

Particularly good heat dissipation is achieved if the heat sink consists of a heat-conducting metal, aluminum or an aluminum alloy being particularly suitable because it is additionally easy to process.

It also leads to a dual function of a component, and consequently to saving of installation space and expenditure on production, if the heat sink is a housing component of a housing accommodating the power electronics.

If the interconnects are produced by punching out or etching out from a copper foil, this requires only little production expenditure.

To be sure to avoid spacers lying on top of one another when producing the power electronics, the spacers may be spherical.

In this case, the spacers preferably consist of an electrically and thermally insulating material, such as glass in particular.

The set object is further achieved by a method of producing a power electronics unit in which a pattern of interconnects is produced from a copper foil by means of punching or etching and is applied by means of a heat-conducting adhesive onto a sheet-like heat sink, in which spacers are mixed in, in which the heat-conducting adhesive is subsequently cured, with the pattern of interconnects being pressed against the heat sink, and in which the power components and control components are thereafter inserted into the pattern of interconnects and soldered.

Only a few, simple production steps are necessary for this method, with the result that the power electronics unit can be produced at low cost. To be able to apply the pattern of interconnects simply onto the heat sink without it being possible for any change to occur in the spatial assignment of the interconnects in relation to one another or possibly also a short-circuit between the interconnects, the copper foil can be covered before the punching or etching with an adhesive tape, which is removed after the pattern of interconnects has been applied onto the heat sink.

In this case, the adhesive tape may be removed before or after the curing of the heat-conducting adhesive.

If appropriate materials are used for the adhesive tape, the removal of the adhesive tape may also be performed by vaporizing during the curing process. It leads to a simple procedure if the heat-conducting adhesive is printed onto the heat sink and the punched-out or etched-out pattern of interconnects is subsequently applied onto the printed-on heat-conducting adhesive.

A further possibility for achieving the object is that, in a method of producing a power electronics unit, a copper foil is applied onto a heat sink by means of a heat-conducting adhesive into which spacers have been mixed, after that the heat-conducting adhesive is cured, with the copper foil being pressed against the heat sink, a pattern of interconnects is subsequently produced from the copper foil by etching and that the power components and control components are subsequently inserted into the pattern of interconnects and soldered. This also allows the handling of an unstable pattern of interconnects to be made easier.

For the curing of the heat-conducting adhesive in the case of the aforementioned methods, heat exposure of the heat-conducting adhesive may additionally take place.

In a way which allows easy handling, the heat-conducting adhesive may be printed onto the heat sink and the copper foil subsequently applied onto the printed-on heat-conducting adhesive. For etching the copper foil, it is coated with a photoresist, exposed after first placing on a mask with a pattern of interconnects cut out in negative form, and subsequently subjected to an etching operation.

BRIEF DESCRIPTION OF THE DRAWINGS

An exemplary embodiment of the invention is represented in the drawing and is described in more detail below. The single FIGURE of the drawing shows a power electronics unit in side view.

DETAILED DESCRIPTION OF THE PREFERRED EMBODIMENT

The power electronics unit represented has a sheet-like heat sink 1 made of aluminum, the upper side of which is planar and the underside of which is provided with cooling ribs 2. A layer of heat-conducting adhesive 3 into which spherical spacers 4 made of glass were mixed has been applied by a printing operation onto the upper planar side of the heat sink 1. A pattern of interconnects 5 etched out from a copper foil has been applied onto this layer of heat-conducting adhesive 3, said interconnects having been placed onto the layer of heat-conducting adhesive 3 during production and then pressed onto the heat-conducting adhesive 3 until they come to bear against the spacers 4. This created an electrical insulating layer, formed by the heat-conducting adhesive 3, the thickness of which is determined by the diameter of the spacers 4. These spacers 4 were chosen with a diameter which ensures electrical insulation of the interconnects 5 with respect to the heat sink 1.

For easy handling of the etched-out pattern of interconnects 5, this pattern was completely covered with adhesive tape, by which this pattern was stabilized. During the pressing on of the interconnects 5, the entire unit was at the same time exposed to heat, whereby the heat-conducting adhesive 3 was cured. Subsequently, the adhesive tape was pulled off the interconnects 5 and power components 6 and control components 7 were applied and soldered to the interconnects 5.

Such a power electronics unit may be advantageously used, for example, in the case of adjusting devices in a motor vehicle, as are required for example for the throttle adjustment in throttle housings. However, an application is also advantageously possible in the low-power range, such as in the case of sensors and electrical plug-in connectors.

List of designations
1 heat sink
2 cooling ribs
3 heat-conducting adhesive
4 spacers
5 interconnects
6 power component
7 control component

What is claimed is:

1. A power electronics unit, in particular for a device in a motor vehicle, with a sheet-like carrier element, on which interconnects are arranged for electrical connection of electrical power components and control components of a circuit, also located on the carrier element, wherein the carrier element is a heat sink (1), on which the interconnects (5) have been applied by means of a heat-conducting adhesive (3), wherein the interconnects comprise punched or etched foil spaced apart from the carrier element by a layer of the adhesive, and a minimum thickness of the heat-conducting adhesive (3) to allow the heat-conducting adhesive (3) to be an electrical insulating layer is ensured by spacers (4) in the heat-conducting adhesive (3).

2. The power electronics unit as claimed in claim 1, wherein the heat sink (1) is made of a heat-conducting metal.

3. The power electronics unit as claimed in claim 2, wherein the heat sink (1) is made of aluminum or an aluminum alloy.

4. The power electronics unit as claimed in claim 1, wherein the heat sink is a housing component of a housing accommodating the power electronics.

5. The power electronics unit as claimed in claim 1, wherein the interconnects (5) comprised a copper foil.

6. The power electronics unit as claimed in claim 1, wherein the spacers (4) are spherical.

7. The power electronics unit as claimed in claim 1, wherein the spacers (4) are made of an electrically and thermally insulating material.

8. The power electronics unit as claimed in claim 7, wherein the spacers (4) are made of glass.

* * * * *